United States Patent [19]

Sullivan

[11] Patent Number: 6,129,048

[45] Date of Patent: Oct. 10, 2000

[54] SUSCEPTOR FOR BARREL REACTOR

[75] Inventor: Steven M. Sullivan, St. Charles, Mo.

[73] Assignee: MEMC Electronic Materials, Inc., St. Peters, Mo.

[21] Appl. No.: 09/107,728

[22] Filed: Jun. 30, 1998

[51] Int. Cl.[7] .................................................. C23C 16/00
[52] U.S. Cl. ........................................ 118/728; 118/730
[58] Field of Search ................................... 118/500, 728, 118/730

[56] References Cited

U.S. PATENT DOCUMENTS

| | | |
|---|---|---|
| 3,675,619 | 7/1972 | Burd . |
| 3,806,360 | 4/1974 | Briody . |
| 4,728,389 | 3/1988 | Logar . |
| 4,823,736 | 4/1989 | Post et al. ............................. 118/730 |
| 5,288,364 | 2/1994 | Burt et al. . |
| 5,298,107 | 3/1994 | Scudder et al. . |
| 5,350,455 | 9/1994 | Mahler . |
| 5,373,806 | 12/1994 | Logar . |
| 5,374,159 | 12/1994 | Severns et al. . |
| 5,439,523 | 8/1995 | Yamaguchi . |
| 5,441,571 | 8/1995 | Ohta et al. . |
| 5,476,359 | 12/1995 | Severns et al. . |
| 5,518,549 | 5/1996 | Hellwig . |
| 5,527,393 | 6/1996 | Sato et al. . |

FOREIGN PATENT DOCUMENTS 6-112126  4/1994  Japan .................................. 118/730

OTHER PUBLICATIONS

M.L. Hammond, "Introduction to Chemical Vapor Deposition", Solid State Technology, Dec. 1979, pp. 61–65.

Primary Examiner—Leo B. Tentoni
Attorney, Agent, or Firm—Senniger, Powers, Leavitt & Roedel

[57] ABSTRACT

A susceptor for supporting wafers in a reaction chamber of a barrel reactor during a chemical vapor deposition process. The susceptor includes a body sized and shaped for receipt within the reaction chamber of the barrel reactor. The body includes a generally laterally facing, sloped face having a plurality of circular recesses therein for receiving wafers to support the wafers with one surface directed generally laterally outward for exposure to reactant gas inside the reaction chamber of the barrel reactor during the chemical vapor deposition process. Each of the plurality of recesses has a substantially planar bottom and opposing arcuate wall portions on opposite sides of the planar bottom. Each wall portion intersects and merges with a corresponding wall portion of at least one adjoining recess of the plurality of recesses at an intersection. The wall portions at the intersections have a smooth shape which is continuous and uninterrupted with respect to at least one adjoining wall portion thereby inhibiting epitaxial deposition between the wafers and the susceptor at the intersections and reducing wafer chipping when the wafers are removed from the recesses following the chemical vapor deposition process.

18 Claims, 3 Drawing Sheets

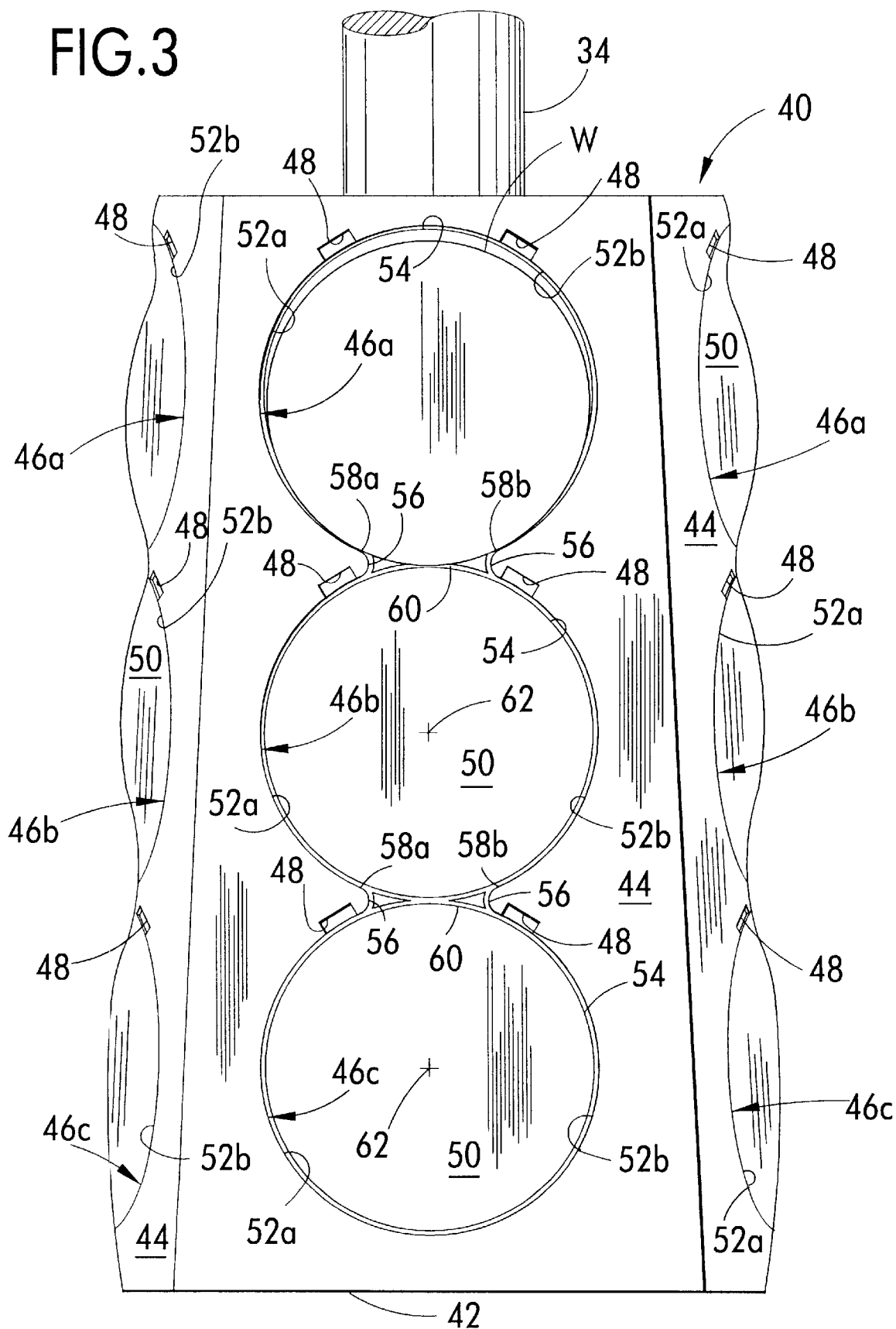

6,129,048

SUSCEPTOR FOR BARREL REACTOR

BACKGROUND OF THE INVENTION

This invention relates generally to chemical vapor deposition of material on semiconductor wafers, and more particularly to an improved susceptor for supporting wafers in a reaction chamber of a barrel reactor during a chemical vapor deposition process.

Chemical vapor deposition is a process for growing a thin layer of material on a semiconductor wafer so its lattice structure is identical to that of the wafer. Using this process, a layer having different conductivity may be applied to a semiconductor wafer to achieve desired electrical properties. Generally, chemical vapor deposition is accomplished by introducing a reactant gas comprising the deposition material (e.g., silicon) and a carrier gas into a reaction chamber of a barrel reactor containing wafers.

The wafers are held in the reaction chamber on a susceptor so one face of the wafer is exposed to the reactant gas. The susceptor is suspended inside the reaction chamber and slowly rotates to evenly distribute the reactant gas over the wafers. Although other shapes are used, susceptors are generally prismatic and have several (e.g., five) planar faces. A face of a conventional susceptor is shown in FIG. 1 and is designated by the reference numeral 10. Circular recesses 12 are formed in the face 10 for holding wafers W in a generally vertical orientation (i.e., so they face generally laterally outward). Conventional susceptors are slightly tapered so their tops are smaller than their bottoms. This tapered configuration allows the wafers to lean inward into the recesses so gravity holds the wafers generally upright against the susceptor. The recesses have a slightly larger diameter than the diameter of the wafers to provide clearance for grasping the wafers when removing them from the recesses. For instance, a susceptor for processing 150 mm diameter wafers may have recesses which are approximately 160 mm in diameter. Two rectangular depressions 16 near the top of each recess 12 provide addition clearance for grasping the wafers. In order to reduce the height of the susceptors, the recesses overlap as shown in FIG. 1.

Reactant gas not only deposits on the wafers but also on many interior features of the reaction chamber, and it preferentially deposits on nucleation sites such as particles and sharp edges in the chamber. Due to the overlapped configuration of the recesses, sharp corners 14 are formed on the susceptor at the intersections of the recesses 12 as shown in FIG. 1. Reactant gas tends to deposit on these sharp corners 14. Because the wafers W rest against these corners 14, the deposits bridge the gap between the wafers and the corners of the susceptor. When the wafers are removed from the susceptor after the chemical vapor deposition process is complete, these bridges hold the wafers against the susceptor, sometimes cracking or chipping the wafers as they are removed from the susceptor. These cracks or chips frequently cause the wafers to fail during later processing. In addition, the bridges occasionally cause the corners on the susceptor to break. The broken susceptor corners increase the propensity for gas to deposit at the corners. Thus, broken corners necessitate early replacement of the susceptors which causes more frequent production down time.

SUMMARY OF THE INVENTION

Among the several objects and features of the present invention may be noted the provision of a susceptor which reduces bridging between the wafer and susceptor; the provision of a susceptor which reduces wafer failures; and the provision of a susceptor which has an increased life.

The susceptor of the present invention generally comprises a body sized and shaped for receipt within the reaction chamber of the barrel reactor. The body includes a generally laterally facing, sloped face having a plurality of circular recesses therein for receiving wafers to support the wafers with one surface directed generally laterally outward for exposure to reactant gas inside the reaction chamber of the barrel reactor during the chemical vapor deposition process. Each of the plurality of recesses has a substantially planar bottom and opposing arcuate wall portions on opposite sides of the planar bottom. Each wall portion intersects and merges with a corresponding wall portion of at least one adjoining recess of the plurality of recesses at an intersection. The wall portions at the intersections have a smooth shape which is continuous and uninterrupted with respect to at least one adjoining wall portion thereby inhibiting epitaxial deposition between the wafers and the susceptor at the intersections and reducing wafer chipping when the wafers are removed from the recesses following the chemical vapor deposition process.

Other objects and features will be in part apparent and in part pointed out hereinafter.

BRIEF DESCRIPTION OF THE DRAWINGS

FIG. 3 is a side elevation of a susceptor of the present invention.

Corresponding reference characters indicate corresponding parts throughout the several views of the drawings.

DETAILED DESCRIPTION OF THE PREFERRED EMBODIMENTS

Figure 1:
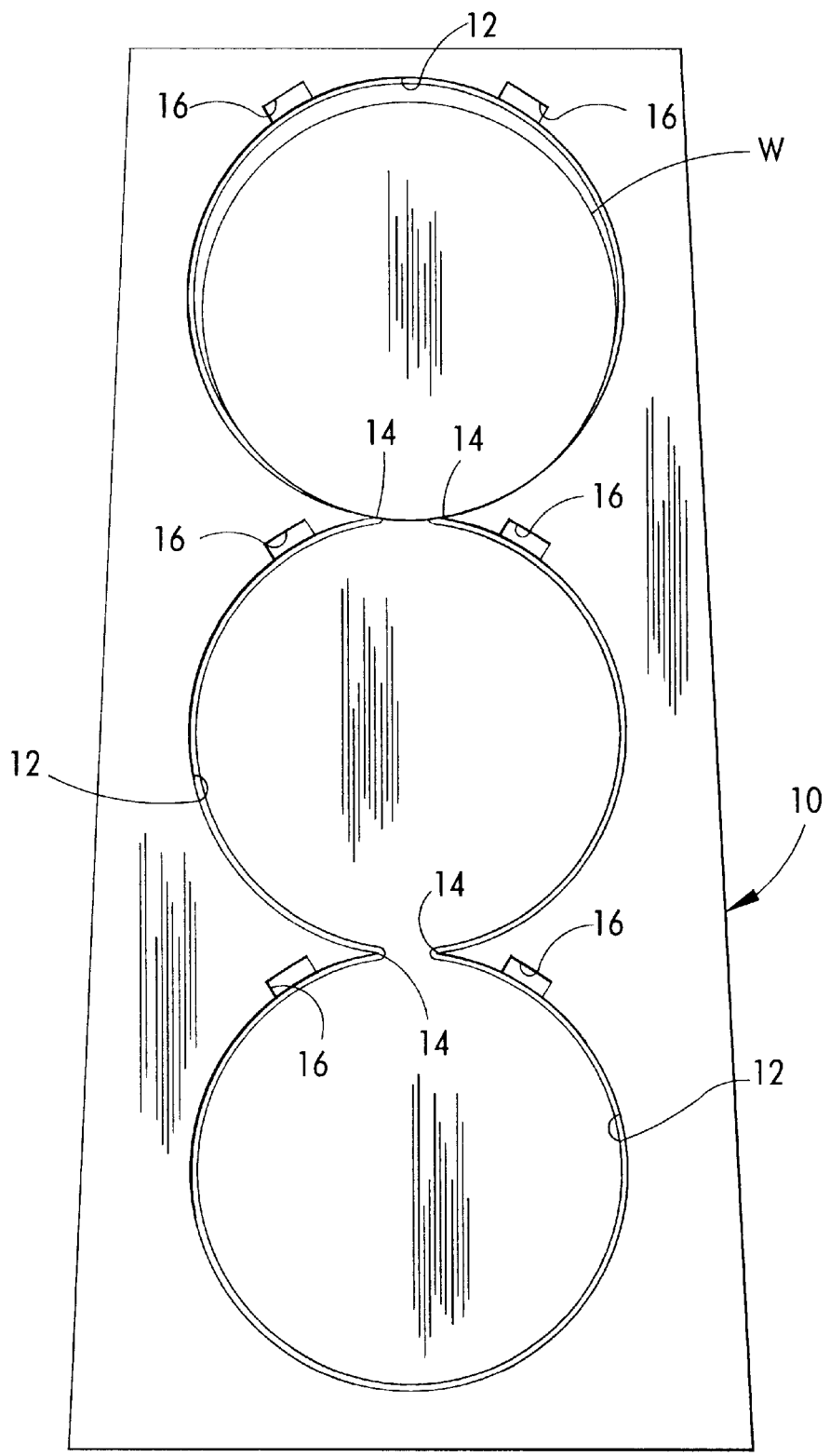
FIG. 1 is a side elevation of a prior art susceptor face.
Figure 2:
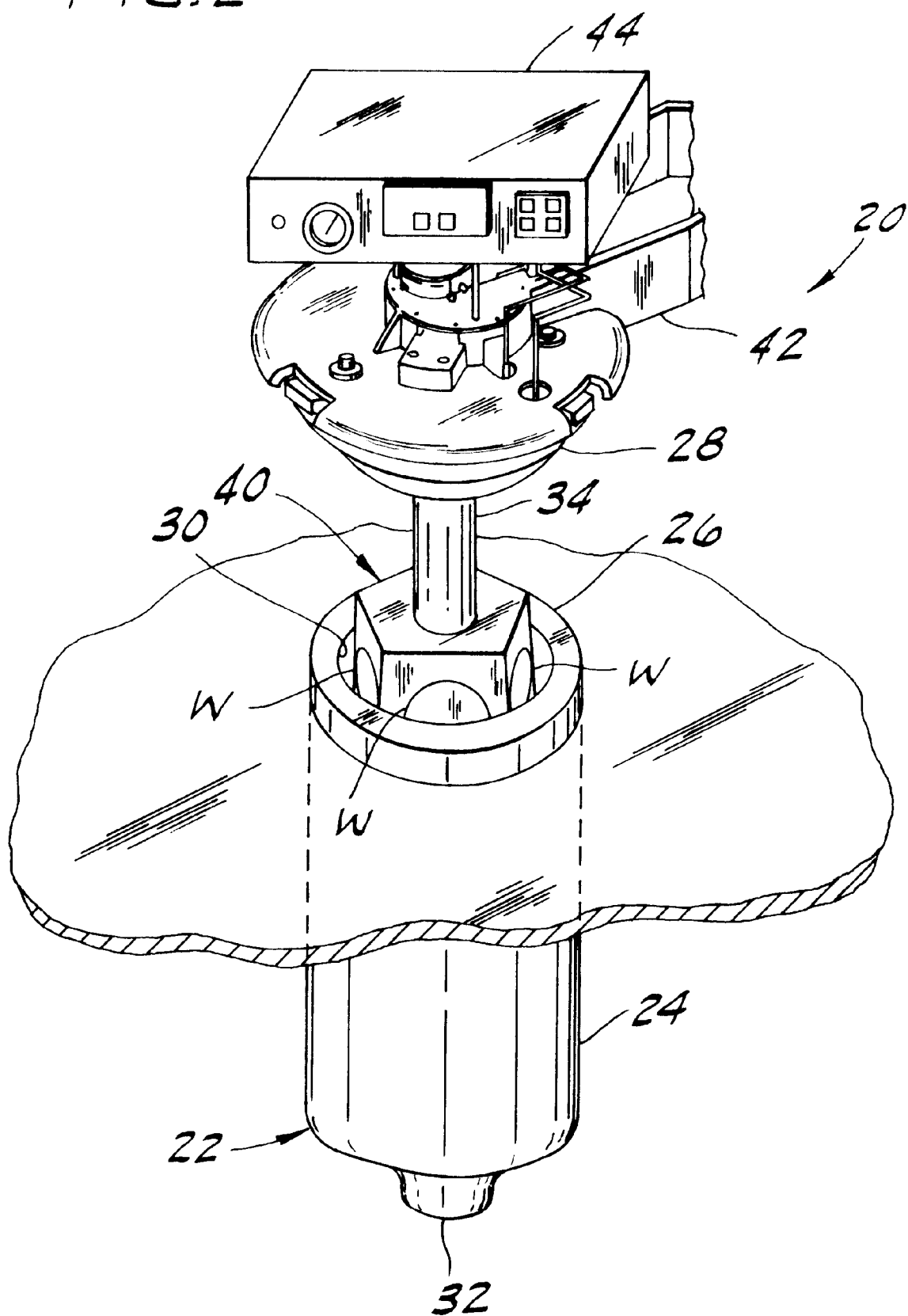
FIG. 2 is a fragmentary perspective of a barrel reactor.

Referring now to the drawings and in particular to FIG. 2, a barrel reactor for depositing a material (e.g., silicon) on a semiconductor wafer W is indicated generally at 20. The reactor 20 comprises a vessel (generally designated by 22) formed from an inverted bell jar 24, a gas ring 26 mounted on the upper end of the bell jar, and a seal plate 28 for selectively covering the gas ring to isolate a reaction chamber 30 inside the vessel. Reactant gas is injected into the reaction chamber 30 through the gas ring 26 and exhausted through a vent 32 at the bottom of vessel 22. A hanger 34 suspended from the seal plate 28 holds a susceptor, generally designated 40, in the reaction chamber 30 for supporting wafers W during the chemical vapor deposition process. After the process is complete, a lift assembly 42 raises the seal plate 28, hanger 34, and susceptor 40 to open the chamber 30 and withdraw the susceptor from the chamber so the wafers W may be unloaded. A motor (not shown) housed in the seal plate 28 turns the hanger 34 and susceptor 40 during the chemical vapor deposition process. The operation of the motor is controlled by a controller 44 mounted above the seal plate 28. The previously described aspects of the reactor 20 are conventional and well known in the art. Accordingly, they will not be described in further detail.

As illustrated in FIG. 3, the susceptor 40 has a generally prismatic body 42 sized and shaped for receipt within the reaction chamber 30 (FIG. 2) of the barrel reactor 20 (FIG. 2). Although the susceptor may be made of other materials without departing from the scope of the present invention, the susceptor 30 of the preferred embodiment is made of silicon-coated graphite. The body 42 has five generally laterally facing, sloped faces 44 (only three faces are visible in FIG. 3). Each face 44 has three circular recesses, generally indicated at 46a–46c, aligned in a vertical column. The body 42 is slightly tapered so its top is smaller than its bottom and so the faces 44 are tilted. This configuration allows the wafers W to lean inward into the recesses 46a–46c so gravity holds the wafers generally upright against the susceptor 40. Although the susceptor 40 of the preferred embodiment has five faces 44, the susceptor may have fewer or more faces without departing from the scope of the present invention. Likewise, even though each face 44 of the susceptor 40 of the preferred embodiment has three circular recesses 46a–46c, each face may have fewer or more recesses and the recesses may have other shapes without departing from the scope of the present invention. Moreover, although the recesses 46a–46c of the preferred embodiment are vertically aligned in a column, they may be laid out in other configurations without departing from the scope of the present invention.

The recesses 46a–46c have a slightly larger diameter than the diameter of the wafers W to provide clearance for grasping the wafers when removing them from the recesses. For example, the susceptor 40 of the preferred embodiment which is intended to process 150 mm diameter wafers has recesses 46a–46c which are approximately 160 mm in diameter. Two rectangular depressions 48 near the top of each recess 46a–46c provide access for grasping the wafers when removing them from the recesses. Each recess 46a–46c has a substantially planar bottom 50 and opposing arcuate wall portions 52a, 52b on opposite sides of the planar bottom. Grooves 54 surround the planar bottom 50 to eliminate the filets between the bottom and the wall portions 52a, 52b so the wafers W lay flat against the bottom. Although the grooves 54 may have other dimensions without departing from the scope of the present invention, the grooves of the preferred embodiment are approximately 0.010 inches deep and approximately 0.045 inches wide. In order to reduce the vertical height of the susceptor 40, the recesses 46a–46b overlap as shown in FIG. 3. Each wall portion 52a, 52b intersects and merges with a corresponding wall portion at an intersection 56 of one or more of the adjoining recesses 46a–46c. The bottom 50 of each recess 46a–46c is continuous and co-planar with the bottom of the adjoining recess. In addition, the wall portions 52a, 52b corresponding to the upper and middle recesses 46a, 46b, respectively, have lower ends 58a, 58b, respectively, separated by openings 60 positioned below centers 62 of the recesses.

As shown in FIG. 3, the wall portions 52a, 52b have a smooth shape at the intersections 56. More particularly, the lower ends 58a, 58b of the wall portions 52a, 52b of the upper and middle recesses 46a, 46b have a smooth shape which extends away from the center 62 of the corresponding recess. The phrase "smooth shape" is used herein to mean that the wall portions 52a, 52b are continuous and uninterrupted with respect to at least one of the adjoining wall portions. Preferably, the shape is curved and most preferably the shape is circular at the intersections 56. This configuration inhibits epitaxial deposition between the wafers W and the susceptor 40 at the intersections 56 and reduces wafer chipping when the wafers are removed from the recesses 46a–46c following the chemical vapor deposition process. The wall portions 52a, 52b at the intersections 56 of the most preferred embodiment have a radius of between about 0.15 inches and about 0.5 inches, and more preferably a radius of about 0.25 inches.

In view of the above, it will be seen that the several objects of the invention are achieved and other advantageous results attained.

As various changes could be made in the above constructions without departing from the scope of the invention, it is intended that all matter contained in the above description or shown in the accompanying drawings shall be interpreted as illustrative and not in a limiting sense.

What is claimed is:

1. A susceptor for supporting wafers in a reaction chamber of a barrel reactor during a chemical vapor deposition process, the susceptor comprising a body sized and shaped for receipt within the reaction chamber of the barrel reactor, the body including a generally laterally facing, sloped face having a plurality of circular recesses therein for receiving wafers to support the wafers with one surface directed generally laterally outward for exposure to reactant gas inside the reaction chamber of the barrel reactor during the chemical vapor deposition process, each of said plurality of recesses having a substantially planar bottom and opposing arcuate wall portions on opposite sides of the planar bottom, each wall portion intersecting and merging with a corresponding wall portion of at least one adjoining recess of said plurality of recesses at an intersection, the wall portions at the intersections having a smooth shape which is continuous and uninterrupted with respect to at least one adjoining wall portion thereby inhibiting epitaxial deposition between the wafers and the susceptor at the intersections and reducing wafer chipping when the wafers are removed from the recesses following the chemical vapor deposition process.

2. A susceptor as set forth in claim 1 wherein the wall portions at the intersections having a curved shape.

3. A susceptor as set forth in claim 2 wherein the wall portions at the intersections have radii of between about 0.15 inches and about 0.5 inches.

4. A susceptor as set forth in claim 3 wherein the wall portions at the intersections have radii of about 0.25 inches.

5. A susceptor as set forth in claim 3 wherein the wall portions at the intersections are circular.

6. A susceptor for supporting wafers in a reaction chamber of a barrel reactor during a chemical vapor deposition process, the susceptor comprising a body sized and shaped for receipt within the reaction chamber of the barrel reactor, the body including a generally laterally facing, sloped face having upper and lower circular recesses therein for receiving wafers to support the wafers with one surface directed generally laterally outward for exposure to reactant gas inside the reaction chamber of the barrel reactor during the chemical vapor deposition process, each of said upper and lower recesses having a substantially planar bottom and opposing arcuate wall portions on opposite sides of the planar bottom, the bottom of said upper recess being continuous and co-planar with the bottom of said lower recess, the opposing wall portions of said upper recess intersecting and merging with the corresponding wall portions of said lower recess at an intersection so that said upper recess opens into said lower recess, the wall portions at the intersections having a smooth shape which is continuous and uninterrupted with respect to the adjoining wall portions thereby inhibiting epitaxial deposition between the wafers and the susceptor at the intersections of intersecting recess wall portions and reducing wafer chipping when the wafers are removed from the recesses following the chemical vapor deposition process.

7. A susceptor as set forth in claim 6 wherein the wall portions at the intersections having a curved shape.

8. A susceptor as set forth in claim 7 wherein the wall portions at the intersections have radii of between about 0.15 inches and about 0.5 inches.

9. A susceptor as set forth in claim 8 wherein the wall portions at the intersections have radii of about 0.25 inches.

10. A susceptor as set forth in claim 8 wherein the wall portions at the intersections are circular.

11. A susceptor as set forth in claim 6 wherein said upper recess constitutes a top recess, said lower recess constitutes a middle recess, and the face of said body has a bottom circular recess therein for receiving wafers to support the wafers with one surface directed generally laterally outward for exposure to reactant gas inside the reaction chamber of the barrel reactor during the chemical vapor deposition process, said bottom recess having a substantially planar bottom and opposing arcuate wall portions on opposite sides of the planar bottom, the bottom of said bottom recess being continuous and co-planar with the bottom of said middle recess and each of the opposing wall portions of said bottom recess intersecting and merging with the corresponding wall portion of said middle recess at an intersection so that said bottom recess opens into said middle recess, the wall portions at the intersections of the wall portions of the bottom and middle recesses having a continuous, smooth, curved shape thereby inhibiting epitaxial deposition between the wafers and the susceptor at the intersections of intersecting bottom and middle recess wall portions and reducing wafer chipping when the wafers are removed from the recesses following the chemical vapor deposition process.

12. A susceptor as set forth in claim 11 wherein the body has a plurality of generally laterally facing, sloped faces, each face of said plurality of faces having top, middle and bottom circular recesses therein for receiving wafers to support the wafers with one surface directed generally laterally outward for exposure to reactant gas inside the reaction chamber of the barrel reactor during the chemical vapor deposition process.

13. A susceptor as set forth in claim 12 wherein the body has five generally laterally facing, sloped faces, each face of said plurality of faces having top, middle and bottom circular recesses therein for receiving wafers to support the wafers with one surface directed generally laterally outward for exposure to reactant gas inside the reaction chamber of the barrel reactor during the chemical vapor deposition process.

14. A susceptor for supporting a wafer in a reaction chamber of a barrel reactor during a chemical vapor deposition process, the susceptor comprising a body sized and shaped for receipt within the reaction chamber of the barrel reactor, the body including a generally laterally facing, sloped face having a circular recess therein for receiving a wafer to support the wafer with one surface directed generally laterally outward for exposure to reactant gas inside the reaction chamber of the barrel reactor during the chemical vapor deposition process, the recess having a substantially planar bottom and opposing arcuate wall portions on opposite sides of the planar bottom, the wall portions having lower ends separated by an opening positioned below a center of the recess, the lower ends of each wall portion having a smooth shape which is continuous and uninterrupted with respect to the respective wall portion and which extends away from the center of the recess thereby inhibiting epitaxial deposition between the wafer and the susceptor at the lower ends of the wall portions and reducing wafer chipping when the wafer is removed from the recess following the chemical vapor deposition process.

15. A susceptor as set forth in claim 14 wherein the lower end of each wall portion has a curved shape.

16. A susceptor as set forth in claim 15 wherein the lower end of each wall portion has a radius of between about 0.15 inches and about 0.5 inches.

17. A susceptor as set forth in claim 16 wherein the lower end of each wall portion has a radius of about 0.25 inches.

18. A susceptor as set forth in claim 16 wherein the lower end of each wall portion is circular.

\* \* \* \* \*